(12) United States Patent
Garcia

(10) Patent No.: US 6,198,180 B1
(45) Date of Patent: Mar. 6, 2001

(54) MICROMECHANISMS WITH FLOATING PIVOT

(75) Inventor: Ernest J. Garcia, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/346,500

(22) Filed: Jun. 30, 1999

(51) Int. Cl.[7] .......................... H02K 33/00; G02B 26/08; G02B 7/182
(52) U.S. Cl. .......................... 310/36; 359/223; 359/224; 359/872
(58) Field of Search .......................... 310/40 MM, 15, 310/17, 20–22, 25–26, 28–29, 36, 37–39, 309, 323, 328, 330, 333, 345, 348, 355; 359/223, 224, 225, 838, 846–849, 871, 872, 875, 881

(56) References Cited

U.S. PATENT DOCUMENTS

| | | | | |
|---|---|---|---|---|
| 5,097,354 | * | 3/1992 | Goto | 359/212 |
| 5,245,464 | * | 9/1993 | Jensen | 359/224 |
| 5,523,878 | * | 6/1996 | Wallace et al. | 359/290 |
| 5,529,277 | * | 6/1996 | Ostaszewski | 248/603 |
| 5,583,688 | * | 12/1996 | Hornbeck | 359/291 |
| 5,646,768 | * | 7/1997 | Kaeriyama | 359/224 |
| 5,739,941 | * | 4/1998 | Knipe et al. | 359/224 |
| 5,917,647 | * | 6/1999 | Yoon | 359/298 |

* cited by examiner

Primary Examiner—Nestor Ramirez
Assistant Examiner—Dang Dinh Le
(74) Attorney, Agent, or Firm—Brian W. Dodson

(57) ABSTRACT

A new class of tilting micromechanical mechanisms have been developed. These new mechanisms use floating pivot structures to relieve some of the problems encountered in the use of solid flexible pivots.

14 Claims, 7 Drawing Sheets

MICROMECHANISMS WITH FLOATING PIVOT

This invention was made with Government support under Contract DE-AC04-94DP85000 awarded by the U.S. Department of Energy. The Government has certain rights in the invention.

BACKGROUND

The present invention relates generally to micromechanisms, and more specifically to micromechanisms comprising pivoting structures.

Although there is no precise referent for the term "micromechanical", its common use is to machinery whose size scale makes invalid most of our assumptions about machinery of ordinary dimensions. For example, whereas at ordinary dimensions the strength of materials is usually limited by mechanisms involving motion and multiplication of dislocations in response to applied stress, in the micromechanical regime surface erosion and cleavage modes of failure are more common. Again, whereas at ordinary dimensions fluid lubrication of frictionally related elements (e.g., an axle and a shaft bearing) is one of a handful of practical choices, in the micromechanical regime the viscous shear stress of a lubricant increases in inverse proportion to the size scale of the apparatus, increasing the energy dissipation rate to unusable levels.

When the change in size scale renders conventional practice invalid, it also enables new approaches toward micromechanical functionality. An effective replacement for fluid lubricants can be a surface layer of a solid which is (usually) either amorphous or polycrystalline, is reasonably strong, forms a smooth film on the component surfaces, and has a surface structure that resists bonding with itself.

Consistent with common practice, in this specification the term 'micromechanical' is associated with mechanical apparatus whose functional components have sizes ranging from about 1 mm to about 1 $\mu$m. Such micromechanical apparatus can be made of a wide variety of materials, but perhaps the most common system is a combination of polycrystalline silicon, amorphous silicon, silicon oxides, and silicon nitride. This material system has high material strength and rigidity, high resistance to fracture, can be doped to provide electrically conducting regions, and is relatively easy to directly integrate with microelectronics at a chip level.

A common mechanism in micromechanical apparatus is a tilt stage, whose function is to provide an attached element with a controllable amount of tilt along a predetermined axis or axes. The attached element can be an intrinsic part of the apparatus (e.g., as in an escapement), or an external element which is to be positioned and directed by the apparatus (e.g., a micromirror). The implementations described in this specification will be for micromirror tilt stages, but this should not be taken as an implicit limitation on the scope of the present invention, which can be used in a wide range of pivoting mechanisms.

A typical prior art micromirror tilt stage is shown in FIGS. 1a–1d. FIG. 1a shows a transparent top view of the tilt stage, and FIG. 1b shows a side view. Micromirror 11 is mounted on top of base 10 by flexible pivot 12. (Note that 11 could as easily be a mounting platform for a micromirror or for some other component. The present identification is made for simplicity of description, and not to limit the scope of the present invention.) The top surface of micromirror 11, if necessary, is polished flat and/or coated with a reflective layer.

Capacitor plates 13 and 14 provide the forces which tilt the micromirror. In one working arrangement the micromirror is doped to the point of being a good conductor, and is grounded through flexible pivot 12 and base 10, both of which are also appropriately doped. Capacitor plates 13 and 14 are electrically insulated from the base 10. When a voltage is applied to capacitor plate 13, the micromirror 11 tilts to the left. When a voltage is applied to capacitor plate 14, the micromirror 11 tilts to the right.

If the applied voltage is large enough, the micromirror 11 will tilt until it hits a solid stop. This condition is of interest for designers, as it provides for a precise amount of tilt, and at the same time helps prevent vibration of the micromirror. Two common solid stops are illustrated here. FIG. 1c shows a maximum leftward tilt, the magnitude of the tilt being limited by contact between the micromirror 11 and the base 10. This provides a limitation in many designs, because the micromirror structure is fabricated by growing layers of structural and sacrificial material on top of the base, and then removing the sacrificial material. Practical limitations of such processes limit the thickness of the sacrificial layers to a few microns at most. A typical micromirror can be perhaps 100 $\mu$m across, with a gap separating the micromirror from the base of about 1 $\mu$m. In this case, the maximum tilt angle is limited to about 1°.

FIG. 1d shows a maximal rightward tilt, where the magnitude of the tilt is limited by the presence of stop post 15. Such a stop post can be used if a smaller maximum tilt is desired than results from contact between the micromirror and the base.

In another implementation of this prior art device, a second pair of capacitor plates can be added to the base, thereby allowing an arbitrary tilt direction to be driven electrostatically, as shown in FIG. 2.

Many equivalent mechanisms are known in the art. However, what they share is pivoting about a structure which also provides a permanent physical connection between the moving parts of the tilting structure. For example, whereas the pivoting motion was provided above by the bending of a flexible pivot connecting the micromirror to the base, an equivalent motion can be obtained using a pair of torsional equivalent motion can be obtained using a pair of torsional pivots attached to the sides of the micromirror and to a mounting frame which is attached to the base. Similarly, the top surface of a cantilever beam can be used as a micromirror or as a micromirror mount. Such a cantilever mount can provide multiaxis tilt capability when electrostatic actuators are arranged so that both bending of the cantilever and rotation about the cantilever are driven.

The common factor to these mechanisms is that the pivoting members are solid bodies which pivot through bending and/or torsion. A second prior art mechanism which allows pivoting is the fabrication of actual hinges. A tilt mechanism which illustrates this approach appears in FIGS. 3a–3b.

In the figure, a device to tilt a micromirror is assembled from carefully patterned material and sacrificial layers on a base 500. A micromirror 504 is mounted on top of a mirror frame 503. Mirror frame 503 is rotably fixed to base 500 by a first set of axles 502 attached to mirror frame 503 and rotating in a first pair of bearing blocks 501 which are at the surface of base 500.

Mirror frame 503 is rotably fixed to driving frame 507 by a second set of axles 505 attached to mirror frame 503 and rotating in a second pair of bearing blocks 506 which are attached to driving frame 507. Driving frame 507 is secured to base 500 by a third pair of axles 509 which are attached to the driving frame, and are constrained to slide on the surface of the base by a pair of sliding bearings 508.

Driving frame 507 is moved along the surface of the base by the action of linear transfer beam 513, which transfers motion and force from a bi-directional linear electrostatic actuator comprising comb electrodes 514, 515, 517, and 518. The linear transfer beam 513 is restricted to move substantially along its long axis through the combined action of support bushing 516, beam guides 512, and rotable connection 510 and 511 to the driving frame.

The function of this prior art tilt stage can be understood by comparing the side view of FIG. 3a with FIG. 3b. FIG. 3a shows the 'flat' configuration, in which the electrostatic actuator has pulled linear transfer beam 513 as far to the right as is possible. In the flat configuration the micromirror 504 is in a well-defined position and orientation approximately parallel to the surface of base 500. The exact position can be adjusted in the design phase by placing additional material under either between the micromirror and the mirror frame, or by placing additional material under the mirror frame.

FIG. 3b shows the 'tilted' configuration in which the electrostatic actuator has pushed the linear transfer beam 513 as far to the right as possible. In the tilted configuration micromirror 504 achieves a well-defined position which is tilted at a large angle relative to the surface of base 500.

Although hinged mechanisms of the sort shown in FIG. 3 can be fabricated, their mechanism and structure is quite complex, and rather delicate in operation. Because of the enormous material strength associated with silicon at micromechanical size scales, flexible pivots have proven quite useful for limited tilt angles, but represent a major restriction to the design process, thereby severely limiting the types of mechanisms which can be implemented.

A new approach to the problem of micromechanical pivots is badly needed in this realm of the useful arts.

SUMMARY

The present invention is of a new type of micromechanical pivot, in which initially disjoint components come into contact when a tilting motion is initiated, and thereafter act as a conventional mechanical pivot. Such floating pivots are extremely simple to fabricate, and can replace conventional micromechanical pivots in many instances.

DETAILED DESCRIPTION

Figure 1A:
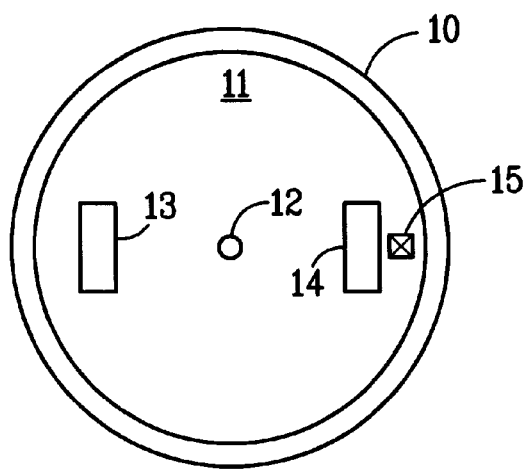
FIGS. 1a–1d show a schematic diagram of a prior art flexible-pivot tilt stage.
Figure 1B:
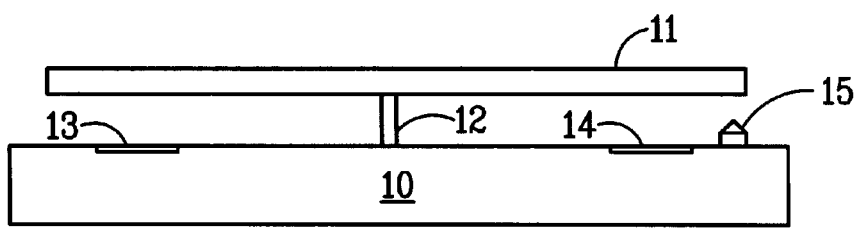
Figure 1C:
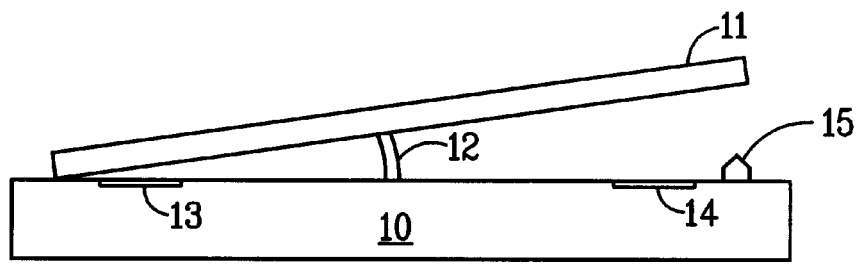
Figure 1D:
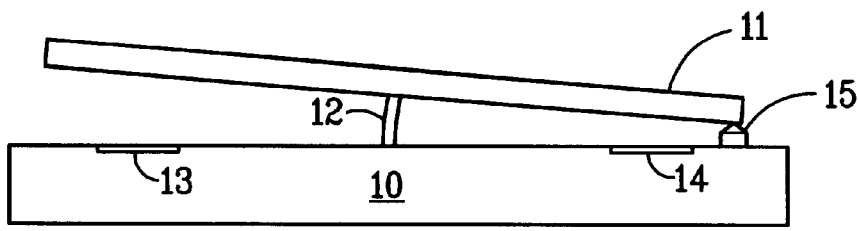
Figure 2:
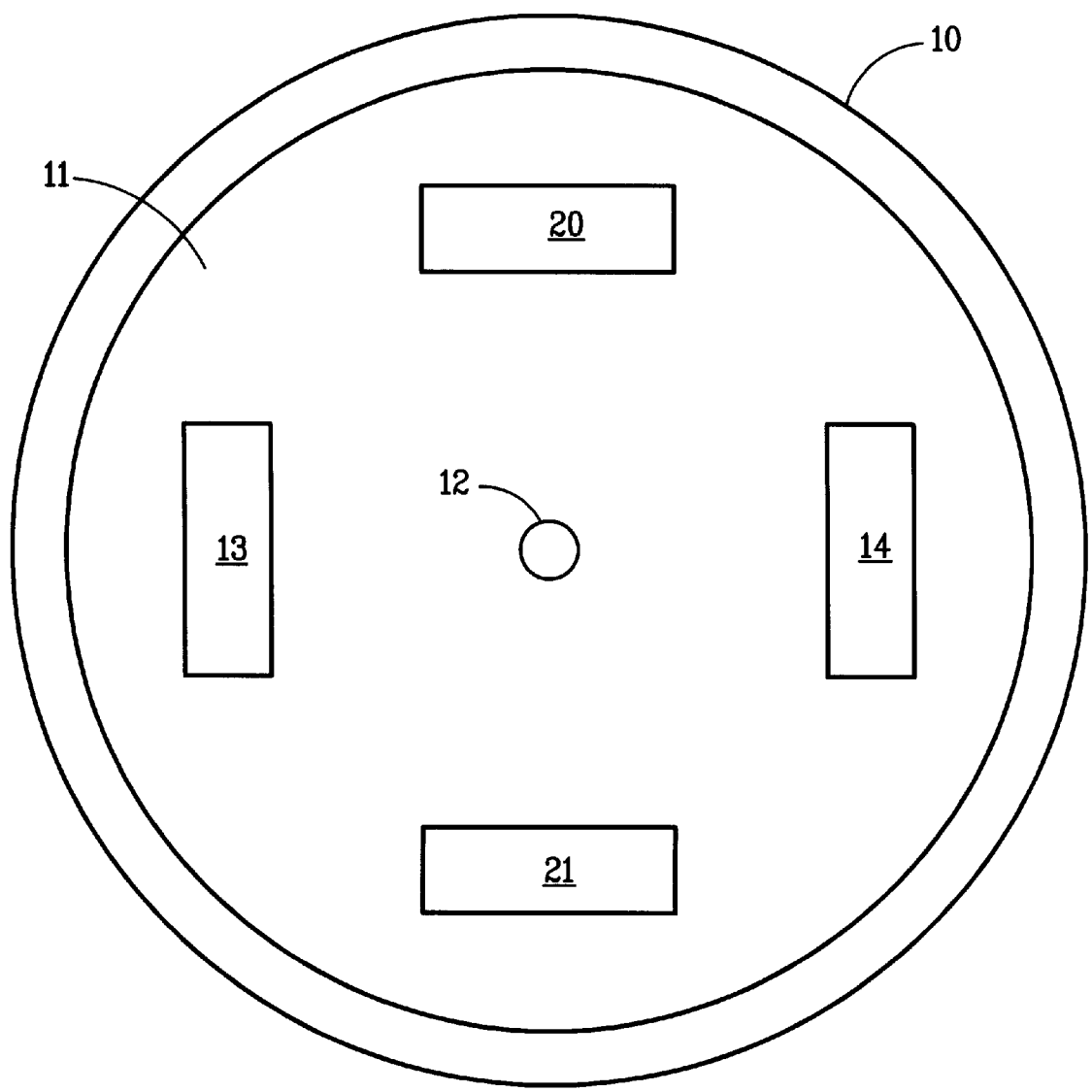
FIG. 2 shows a schematic diagram of a multiaxis prior art flexible-pivot tilt stage.
Figure 3A:
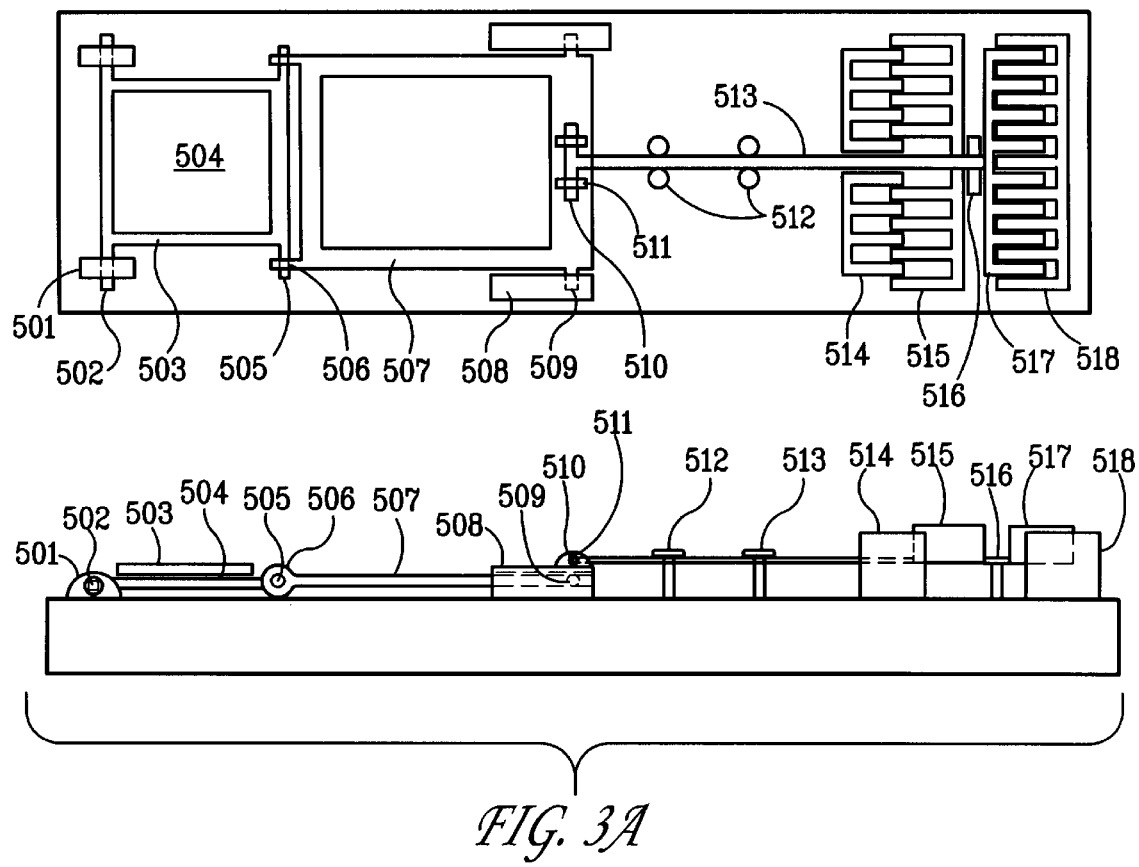
FIGS. 3a–3b show a schematic diagram of a prior art sliding and hinged tilt stage driven by a linear comb drive.
Figure 3B:
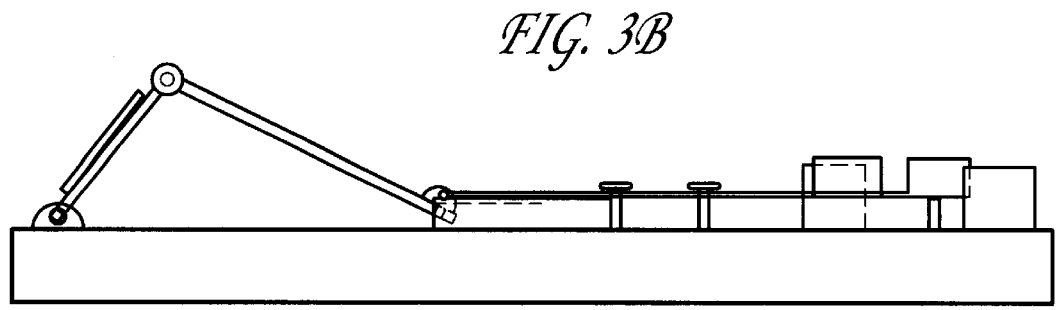
Figure 4A:
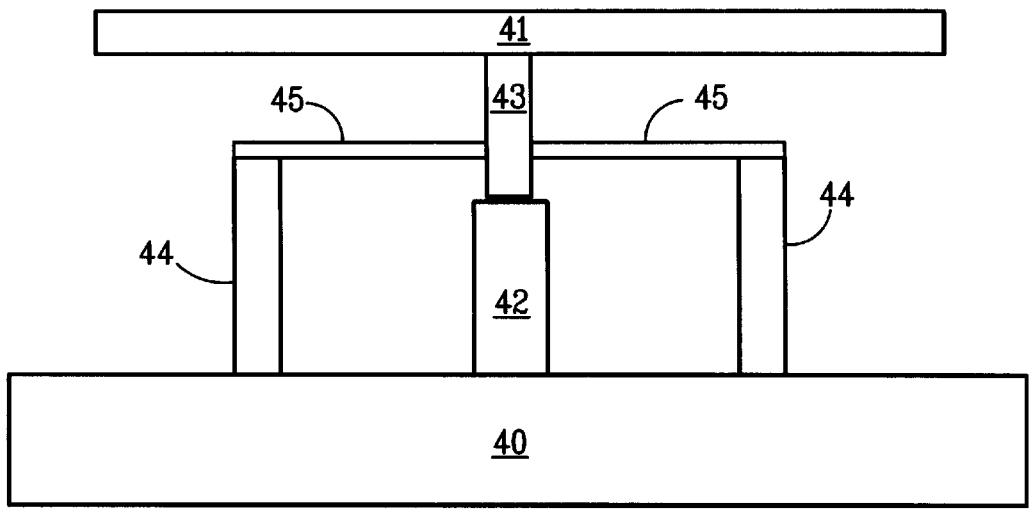
FIGS. 4a–4b show a schematic diagram of a tilt stage comprising a floating pivot according to the present invention.
Figure 4B:
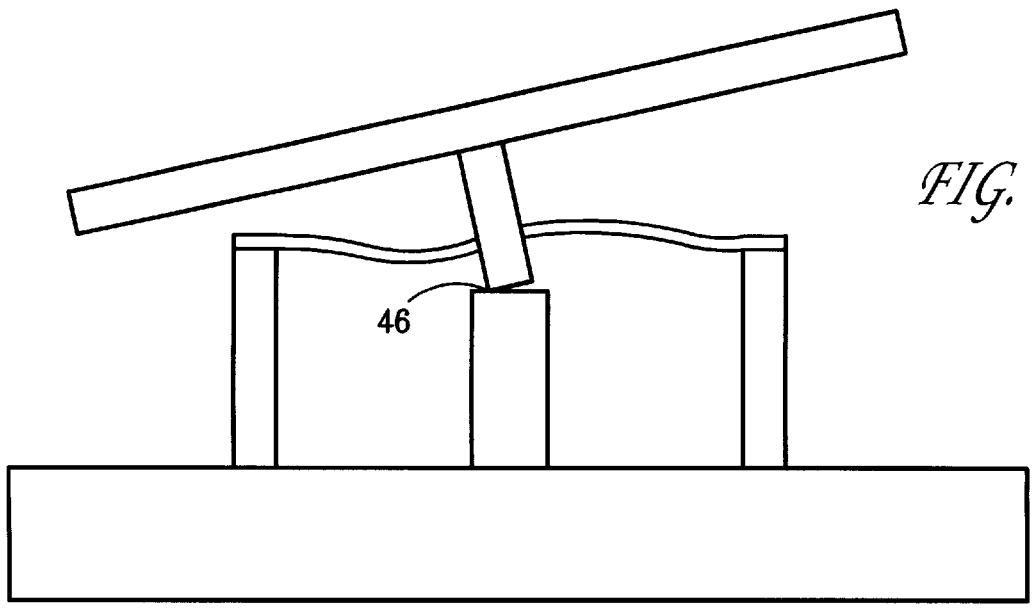

A simple version of a floating pivot micromechanism according to the present invention is shown in FIG. 4a (side view) and FIG. 4b (top view). Here a micromirror 41 is floated over a substrate 40 by the action of suspension springs 45. (As before, although the present invention is being described in terms of a tilt stage for a micromirror, any application suitable for a floating pivot mechanism can be substituted without changing the fundamental nature of the present invention.) These springs are secured to substrate 40 by mounting posts 44, and to the micromirror by spring attachment 43.

As shown, spring attachment 43 and pivot base 42 are positioned so that their ends are aligned and nearly touching. (They can in fact touch, but for the present invention cannot be directly connected.) This alignment is compatible with and sustained by the combined action of the suspension springs 45.

FIG. 4b illustrates the function of the floating pivot apparatus described above. As the micromirror 41 is tilted relative to substrate 40, the edge of spring attachment 43 makes contact with the top surface of pivot base 42, thereby forming a mechanical and functional pivot at point 46.

In general, a pair of structural elements which satisfy the following conditions will be called a floating pivot— one of the elements is functionally attached to the micromirror, the other is functionally attached to the substrate, and the two elements are aligned so that they make contact and form a mechanical pivot when the micromirror tilts. The use of such floating pivots can relieve both design and fabrication constraints which are associated with the use of conventional flexible or hinged pivots.

Figure 5A:
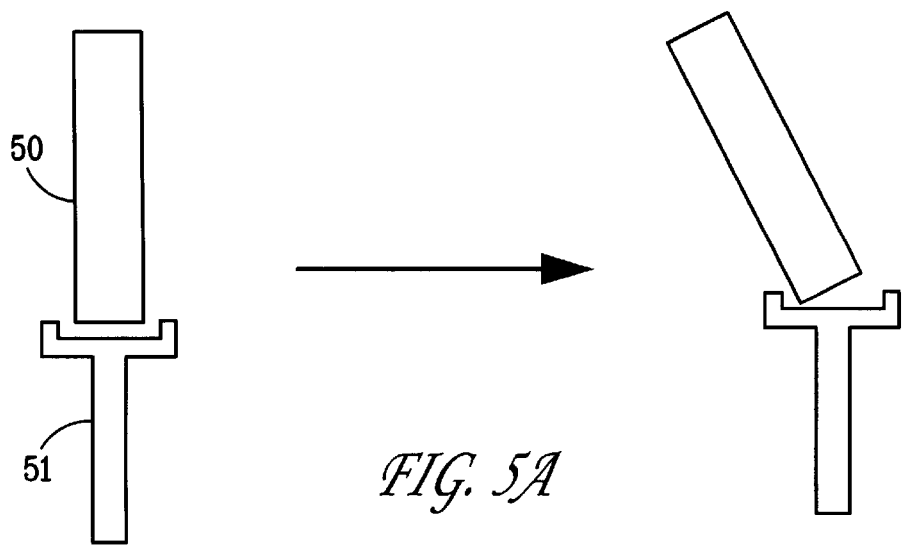
FIGS. 5a–5d show a schematic diagram of various floating pivots according to the present invention.
Figure 5B:
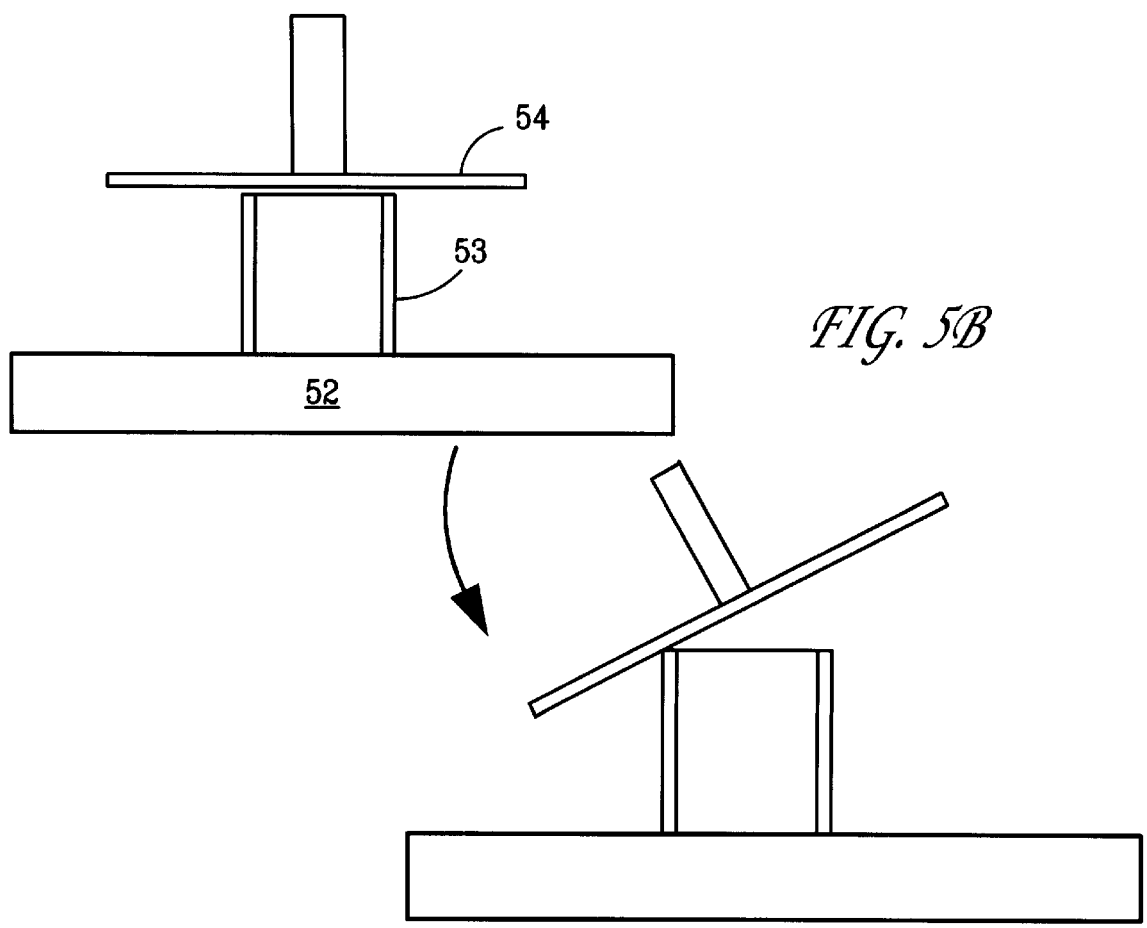
Figure 5C:
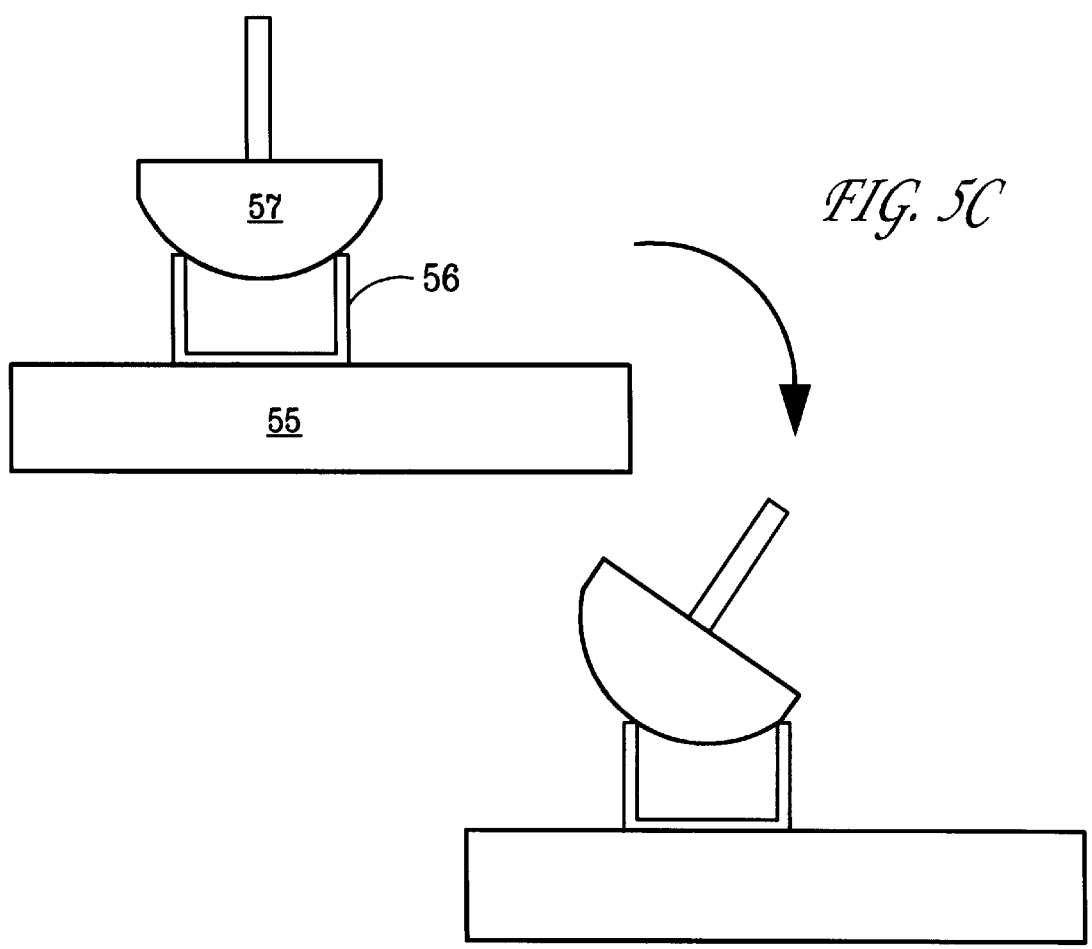
Figure 5D:
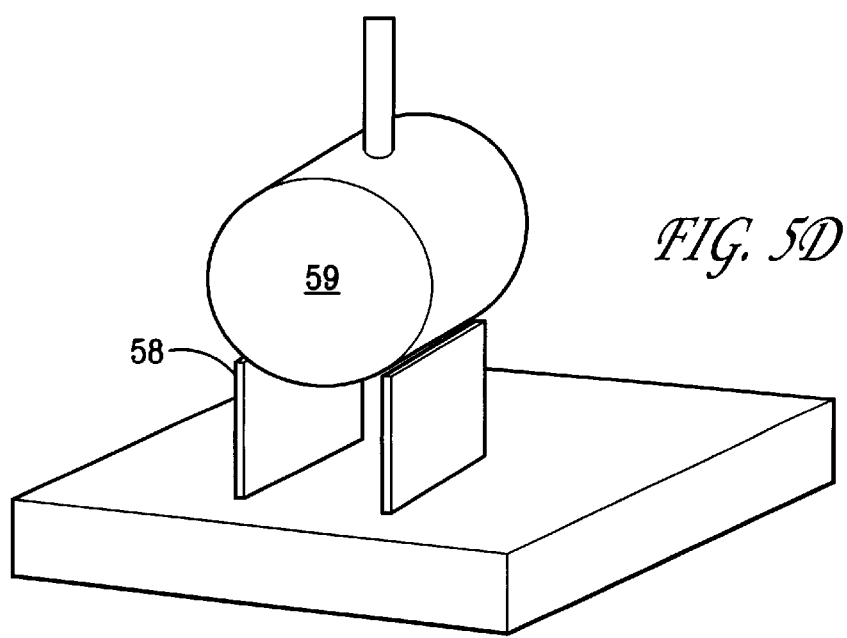

Many types of structures can make floating pivots, as shown in FIGS. 5a–5d. In FIG. 5a, a rod 50 and a pivot cup 51 form a floating pivot, if they replace components 42 and 43 in FIG. 4. In FIG. 5b, ring 53 and plate 54 form a floating pivot if they replace 42 and 43. In FIG. 5c, the combination of ring 56 and sphere 57 form a floating pivot if they replace 42 and 43. Finally, in FIG. 5d, the combination of channel walls 58 and cylinder 59 combine to give a single axis floating pivot when they replace 42 and 43. Many other configurations can form floating pivots.

Clearly, however, a floating pivot only exists in the context of the remainder of the apparatus. As the components which will form the mechanical turning point when they come into contact are held in close proximity indirectly by the remainder of the apparatus, such devices as a ball and socket pivot, where the ball is held directly on the socket (typically using a retaining ring), are not floating pivots.

Figure 6A:
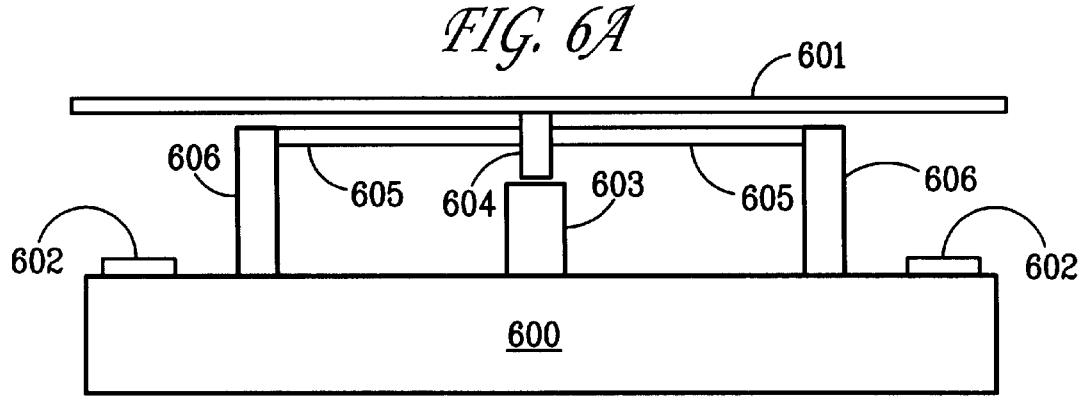
FIGS. 6a–6b show a schematic diagram of a multiaxis tilt stage comprising a floating pivot according to the present invention.
Figure 6B:
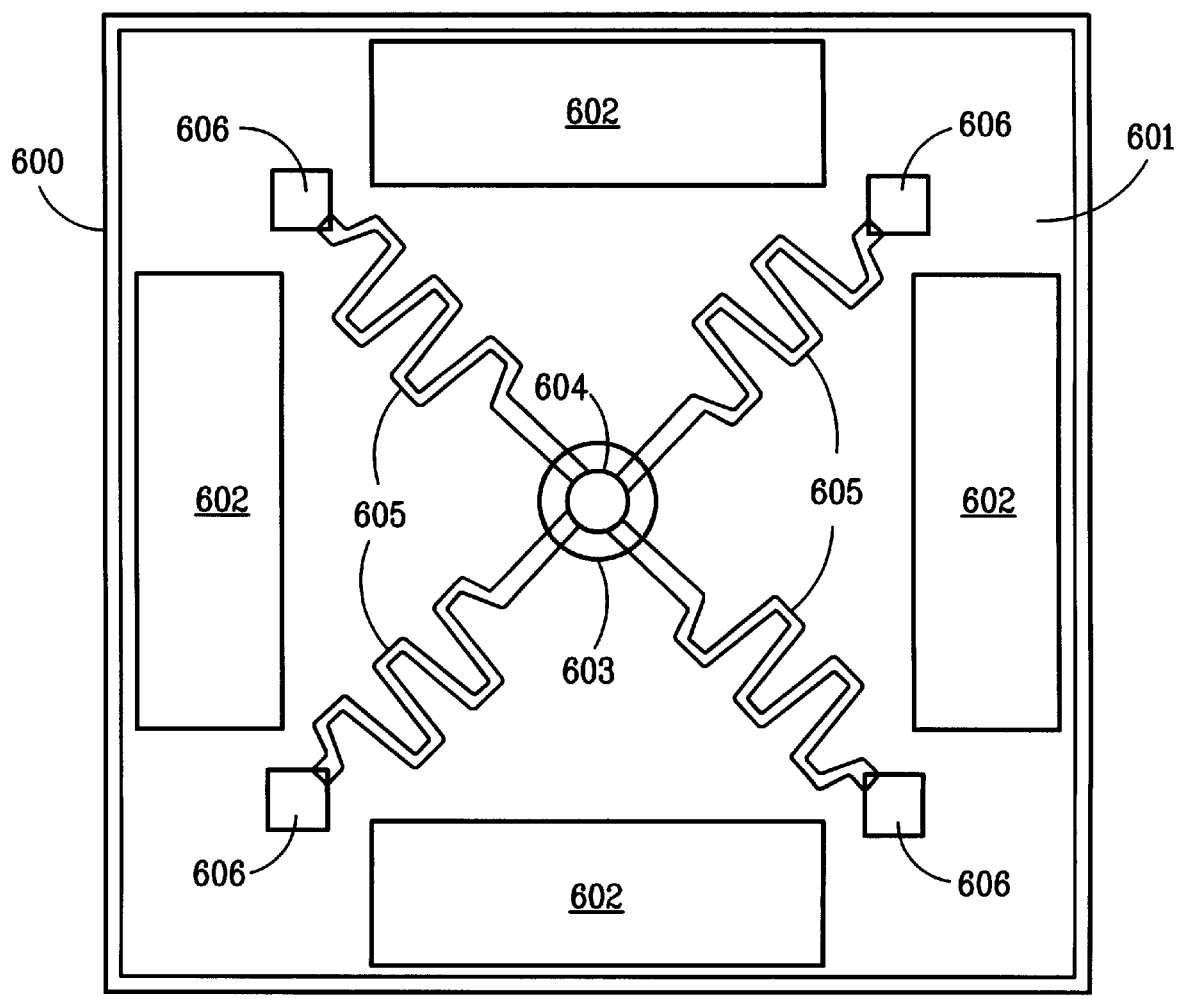

Finally, an multi-axis application for a floating pivot is illustrated in FIGS. 6a–6b. This is a tilt stage capable of being tilted in any direction through the action of integral electrostatic actuators. FIG. 6a shows a side view of this apparatus, and FIG. 6b shows a top view. Tilt platform 601 is suspended above table 600 by a set of suspension springs 605, each of which is attached to a platform mount 604 and to one of the spring anchor rods 606. Pivot base 603 is positioned below platform mount 604, and when the tilt platform 601 begins to tilt, the floating pivot comprising 603 and 604 will make contact and provide a mechanical pivot for the tilt stage.

The electrostatic actuators comprise capacitor pads 602, to each of which is applied a voltage by a power supply (not shown) relative to the tilt platform 601, which is held at ground potential. By applying suitable combinations of voltages to the capacitor plates, and thereby combining the forces generated thereby, this tilt stage can be made to tilt in arbitrary directions.

The examples and implementations described above are intended to illustrate various aspects of the present invention, not to limit the scope thereof. The scope of the invention is set by the claims interpreted in view of the specification.

What is claimed is:

1. A micromechanism comprising a floating pivot, said micromechanism comprising:
   a) a first portion;
   b) a second portion which is to pivot relative to said first portion;
   c) a pivot rod functionally attached to said first portion;
   d) a pivot base functionally attached to said second portion; and,
   e) a suspension attached to said first portion and to said second portion such that the second portion is free to pivot relative to the first portion, and such that the pivot rod and the pivot base are suspended in a relative position as to form the floating pivot between the first portion and the second portion.

2. The micromechanism of claim 1, wherein the mutual configuration of the pivot rod, the pivot base, and the suspension limits said pivoting to a single axis.

3. The micromechanism of claim 1, further comprising at least one actuator, said actuator being functionally attached to the first portion and to the second portion so that activation of the actuator produces said relative pivoting.

4. The mechanism of claim 3, wherein said actuator is electrically activated.

5. The mechanism of claim 4, wherein said actuator is an electrostatic actuator.

6. The mechanism of claim 3, wherein the first portion is functionally attached to a micromirror.

7. The mechanism of claim 3, wherein the first portion comprises a micromirror.

8. The mechanism of claim 1, wherein the first portion is functionally attached to a micromirror.

9. The mechanism of claim 1, wherein the first portion comprises a micromirror.

10. The micromechanism of claim 1, wherein said suspension comprises a network of springs.

11. The micromechanism of claim 1, wherein said suspension comprises a set of flexible members.

12. The micromechanism of claim 1, wherein said suspension comprises a set of torsional members.

13. The micromechanism of claim 1, wherein said suspension comprises polycrystalline silicon.

14. The micromechanism of claim 1, wherein said suspension consists essentially of silicon.

* * * * *